(12) United States Patent
Park et al.

(10) Patent No.: US 7,749,676 B2
(45) Date of Patent: Jul. 6, 2010

(54) POSITIVE TYPE DRY FILM PHOTORESIST AND COMPOSITION FOR PREPARING THE SAME

(75) Inventors: Se-Hyung Park, Seongnam-si (KR); Byoung-Kee Kim, Yongin-si (KR); Jong-Min Park, Anyang-si (KR); Seong-In Baek, Seoul (KR)

(73) Assignee: Kolon Industries, Inc., Kwacheon-si (KR)

( * ) Notice: Subject to any disclaimer, the term of this patent is extended or adjusted under 35 U.S.C. 154(b) by 0 days.

(21) Appl. No.: 11/791,887

(22) PCT Filed: Dec. 7, 2005

(86) PCT No.: PCT/KR2005/004171

§ 371 (c)(1), (2), (4) Date: May 30, 2007

(87) PCT Pub. No.: WO2006/062348

PCT Pub. Date: Jun. 15, 2006

(65) Prior Publication Data

US 2008/0124654 A1    May 29, 2008

(30) Foreign Application Priority Data

Dec. 9, 2004    (KR) .................... 10-2004-0103326

(51) Int. Cl.
*G03F 7/023* (2006.01)
*G03C 1/805* (2006.01)

(52) U.S. Cl. ............... 430/166; 430/165; 430/191; 430/192; 430/193; 430/532

(58) Field of Classification Search ............... 430/165, 430/166, 191, 192, 193, 532
See application file for complete search history.

(56) References Cited

U.S. PATENT DOCUMENTS

| | | | |
|---|---|---|---|
| 4,193,797 A | | 3/1980 | Cohen et al. |
| 4,587,199 A | * | 5/1986 | Bennett ................. 430/260 |
| 4,590,148 A | * | 5/1986 | Takahashi et al. ........ 430/303 |
| 5,077,174 A | | 12/1991 | Bauer et al. |
| 5,648,159 A | * | 7/1997 | Sato ..................... 428/327 |
| 5,981,135 A | | 11/1999 | Koes et al. |
| 6,037,100 A | * | 3/2000 | Yu et al. ................ 430/273.1 |
| 6,468,716 B1 | | 10/2002 | Sugie et al. |
| 6,824,885 B2 | * | 11/2004 | Fitch et al. .............. 428/483 |
| 2003/0087179 A1 | * | 5/2003 | Iwasaki .................. 430/166 |

FOREIGN PATENT DOCUMENTS

| | | |
|---|---|---|
| JP | 2004-115566 A | 4/2004 |
| WO | WO-89/05475 A1 | 6/1989 |

* cited by examiner

*Primary Examiner*—John S Chu
(74) *Attorney, Agent, or Firm*—Birch, Stewart, Kolasch & Birch, LLP

(57) ABSTRACT

A positive type photoresist resin film contains a support film and a positive photoresist resin layer laminated over the support film. The peak height (Rp) of the support film is less than about 300 nm to eliminate fish eye defects. The positive photoresist resin layer may contain alkali soluble resin, a diazide based photosensitive compound, a plasticizer and, optionally, a sensitivity enhancer and a releasing agent.

21 Claims, 2 Drawing Sheets

[Fig. 1]
[Fig. 2]
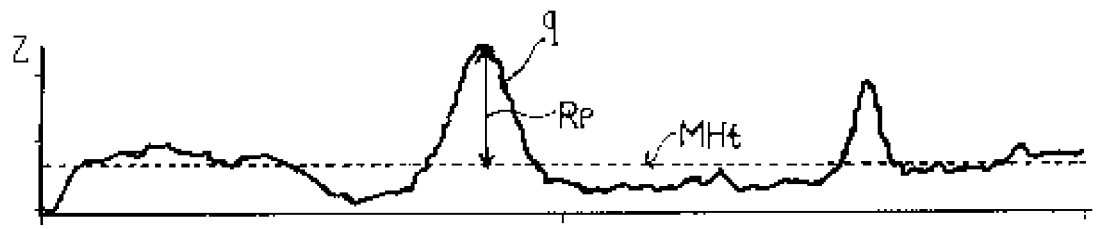
[Fig. 3]
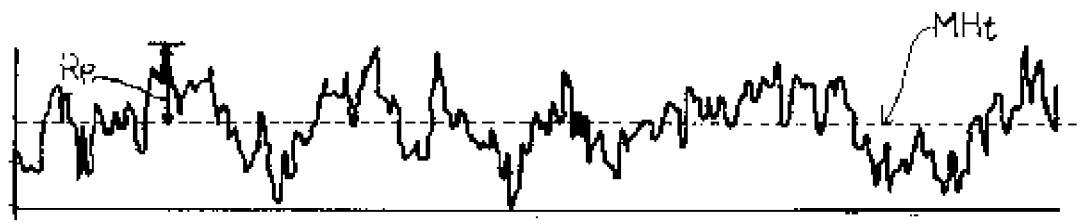
[Fig. 4]
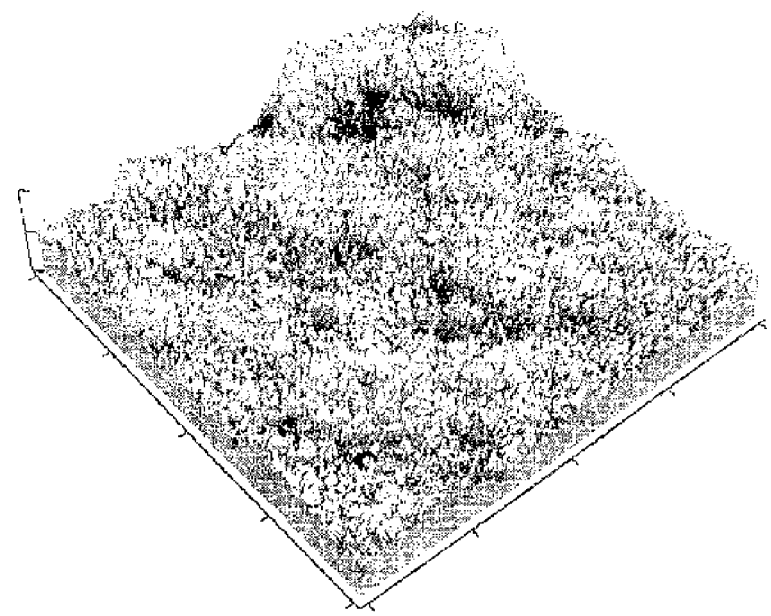

[Fig. 5]
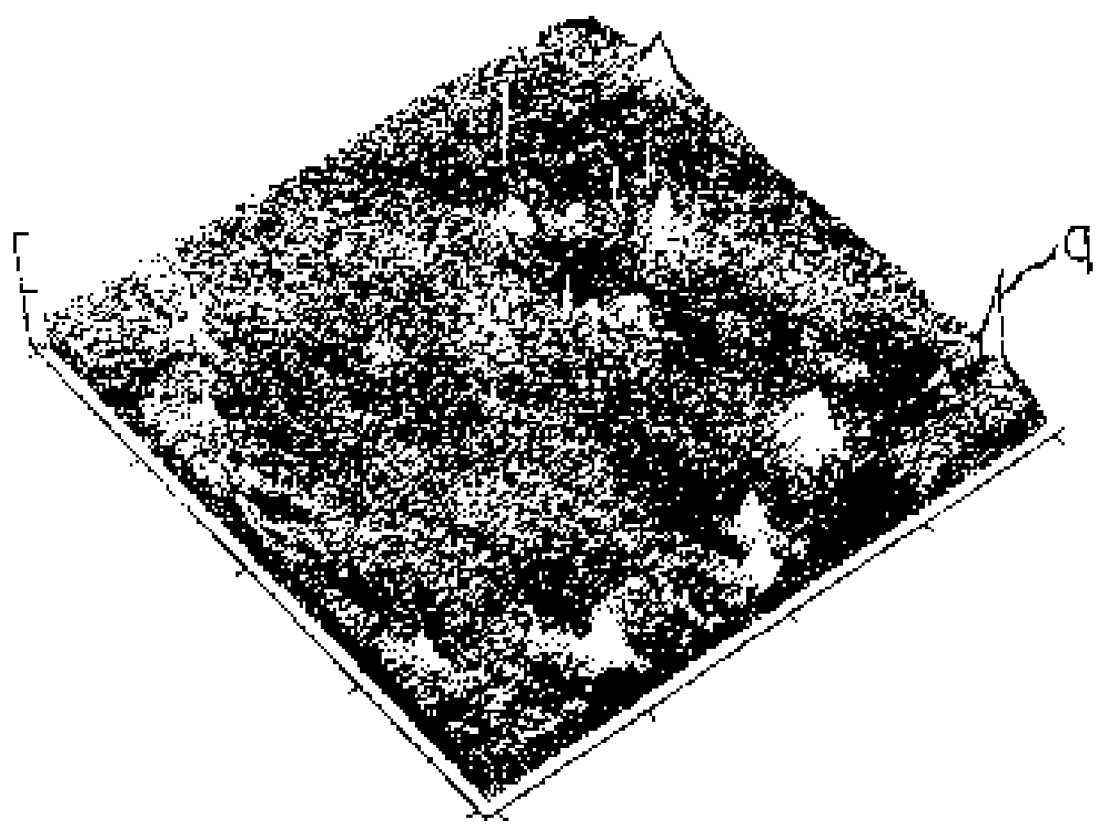

POSITIVE TYPE DRY FILM PHOTORESIST AND COMPOSITION FOR PREPARING THE SAME

FIELD OF THE INVENTION

A positive type dry film photoresist that includes a plasticizer has excellent physical properties such as high film speed (or photosensitizing speed), development contrast, sensitivity, resolution and/or adhesion to a substrate.

BACKGROUND OF THE INVENTION

Photoresists and photoresist films are utilized in the manufacture of highly integrated semiconductors such as integrated circuits (ICs), printed circuit boards (PCB) and electronic display devices such as cathode ray tubes (CRTs), color liquid crystal displays (LCDs) and organic electroluminescent displays (ELs or ELDs). The manufacturing processes for these devices use photolithography and photofabrication techniques. The photoresist films requires a resolution sufficient to form a pattern with extremely fine lines and small space area not more than 7 μm.

The physical properties of photoresists can vary in such characteristics as solubility in a certain solvents, coloration, curing and the like, via chemical modification of the molecular structure of the photoresist resin or the photoresist.

In recent years, processes for manufacturing TFT-LCDs using the liquid photoresist compositions have become increasingly complicated and difficult as substrate sizes are increasing and the problems associated with liquid photoresist compositions have become more marked. Positive liquid photoresists exhibit problems such as reduced resolution and sensitivity due to sedimentation during storage, inferior pattern design due to residues on a coated surface, etc. Therefore, there exists a need to develop novel photoresists to solve such problems.

The desire for positive dry resist technology arose from the disadvantages associated with conventional liquid positive photoresists. These disadvantages led to elevated process costs. For example, spin coating a photoresist onto a semiconductor wafer results in losses of expensive photoresist material. The machinery for spin coating resists represents a substantial capital expense, and the time and management associated with spin coating results in additional process expense. The filtration associated with point-of-use application of photoresists is also cost-intensive. The wastage of photoresists at all points in the spin coating process also represents a substantial part of the photoresist cost. Also, positive liquid photoresist compositions generate insoluble materials (that is, undergoes sedimentation) during storage, leading to reduction of resolution and sensitivity. As a result, a practical dry film positive photoresist technology becomes highly desirable.

Conventional dry film photoresist technology began development during the 1960's when liquid negative photoresists were adapted to dry film technology for the manufacture of large featured, low resolution devices such as printed circuit board (PCB) patterns. However, the poor resolution of these negative dry film resists inhibited the application of dry film technology to high resolution applications such as ICs, LCDs etc.

Positive dry film resists first emerged during the 1980's, where technologies developed that exploited the properties of thermoplastic resins. For example, cellulose resins were utilized as the basis of dry film positive resists (U.S. Pat. No. 5,981,135). Additional dry film positive resists were developed by DuPont (U.S. Pat. No. 4,193,797 and U.S. Pat. No. 5,077,174), which were based upon acrylate or methacrylate resins. These related art thermoplastic positive dry film photoresists thus shared the disadvantages of the negative resists because utilizing cellulosic or acrylic resins yield a thick dry film photoresist that has low resolution.

As a result, application of these related art dry film positive photoresists has proven problematic in regards to the thin films required for advanced semiconductor manufacturing applications. That is, as the photoresist layer widths necessarily become thinner for high resolution photolithography, the requirement for a uniform thin film increases. For example, a thin film of photoresist is more sensitive to external phenomena such as substrate roughness. A sufficiently non-uniform substrate can cause defects in the photoresist layer such as "fish eye".

Also, the physical properties of the photoresist resin or the photoresist can be altered, such as alteration in solubility in a certain solvent (that is, increase or decrease in solubility), coloration, curing and the like, via chemical modification of the molecular structure of the photoresist resin or the photoresist caused in a short time by an optical device.

Additionally, a variety of solvents used to improve physical properties and working stability of a photoresist resin composition have been developed and include, for example, ethyleneglycol monoethylether acetate, propyleneglycol monoethylether acetate, ethyl acetate and the like.

However, these liquid photoresist compositions generate insoluble materials (that is, undergoes sedimentation) during storage, leading to reduction of resolution and sensitivity. For example, a composition comprising alkali soluble novolac resin and, as a photoacid generator, a material containing 1,2-naphthoquinonediazido-4-sulfonic ester and acid decomposable radicals as disclosed in Japanese Patent Laid-Open No. 3-249654, and a composition comprising alkali soluble novolac resin, 1,2-naphthoquinonediazido-4-sulfonic polyhydroxybenzophenone ester and acid decomposable radicals as disclosed in Japanese Patent Laid-Open No. 6-202320 have problems such as reduced resolution and sensitivity due to sedimentation during storage, inferior pattern design due to residues on a coated surface, etc.

Consequently, there is a strong need in the art for an improved photoresist resin product that overcomes various problems such as thickness deviation of the coating layer, poor smoothness, distortion, coagulation, foaming, coating loss and the like, which are caused during necessary processes such as spin-coating or similar processes while forming micro patterns on LCDs, organic ELDs and the like using conventional liquid positive type photoresist compositions; and concurrently exhibits high resolution, excellent line width control ability, high thermal resistance, high sensitivity, high film residual rate, high dry etching resistance and high development properties; and is applicable to micro-fine processing of LCDs, organic ELDs and the like.

SUMMARY OF INVENTION

Accordingly, it is an object of the invention to provide a positive type photoresist resin film which can solve the above problems by eliminating a complicated application process (for example, spin-coating) on a glass substrate required when a related art liquid photoresist composition is used to form micro-circuit patterns on a substrate such as those used in a TFT-LCD, an organic ELD and the like. The inventive dry film resist can form micro-circuit patterns exhibiting physical properties substantially equivalent or superior to those of related art liquid photoresist compositions, and which can adapt to the trend toward increasing substrate area used to form micro circuit patterns.

The invention, in part, pertains to a photoresist resin film containing a sufficiently smooth support film and a positive type photoresist resin layer laminated over the support film. More particularly, the positive type photoresist resin layer comprises an alkali soluble resin, a diazide based photosensitive compound, a plasticizer, advantageously a sensitivity enhancer and, optionally, a releasing agent.

It is to be understood that both the foregoing general description and the following detailed description are exemplary and explanatory and are intended to provide further explanation of the invention as claimed.

DETAILED DESCRIPTION OF THE INVENTION

Advantages of the invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Hereinafter, the invention will be described in detail, especially, in view of technical construction thereof in conjunction with the accompanying drawings.

FIG. 1 shows a positive type photoresist resin film that includes a support film 10 and a positive type photoresist resin layer 20 laminated over the support film 10. Occasionally, in order to improve safety of storage and transportation of the positive type photoresist resin film according to the invention, the film further includes a protective layer (not shown) over the photoresist resin layer 20. The positive type photoresist resin layer 20 can include an alkali soluble resin, a diazide based photosensitive compound, a plasticizer and a sensitivity enhancer.

The positive type photoresist resin film with a laminated structure can eliminate spin-coating the photoresist onto a glass substrate, which is required when a conventional liquid photoresist resin composition is used, thereby solving problems such as thickness deviation during coating, poor smoothness, distortion, coagulation, foaming, solvent output, etc. Utilizing a dry film resist additionally advantageously enhances product yield.

One of the properties of the support film 10 is a peak height (Rp).

The peak height (Rp) is defined as a height difference between a mean height of surface (MHt) and a height of a highest surface peak located in the height profile (direction of z axis) of the selected area.

Hereinafter we refer the "peak height (Rp)" to "Rp".

Also, the mean height of surface (MHt) is defined as an average height of all the top peaks, bottom valleys and anomalous peaks located in the height profile (direction of z axis) of the selected area if anomalous peaks were present in the surface.

FIG. 2 shows the surface with large anomalies of one type of support film 10.

In this case an anomalous peak q can be observed. The effect of this anomalous peak q would be to increase the value for Rp, even though the surface has low height of top peaks and bottom valleys in areas removed from the anomalous peak q.

Also, the presence of an anomaly q can be quite disadvantageous to the properties of a photoresist film formed on the support film 10. When the thickness of the photoresist film is large, the effect of a peak of the support film is minimal. However, as the photoresist film becomes thinner, the projection of a surface anomaly into the photoresist will cause the photoresist layer 20 to become non-uniform to result in the phenomena referred to as "fish eye". That is, as the layer of the photoresist film 20 is reduced to a thickness of about 10 μm, the presence of large anomalies in the support film 10 will tend to result in fish eye formation. As a result, the peak height (Rp) of the support film 10 should be not more than about 300 nm.

Also, the peak height (Rp) of the support film 10 may preferably be about 100 nm or less, although the invention is still effective at a peak height (Rp) of 30 nm (0.03 μm). Also, the peak height (Rp) is ideally reduced as much as is possible, even to 10 nm (0.01 μm) or less. However, a working range for the peak height (Rp) is from 15 to 30 nm.

FIG. 4 shows the surface of an oriented polypropylene (OPP) support film that is relatively free from large anomalies taken by atomic force microscopy (AFM). Here, the surface is relatively free from large anomalous peaks that can cause defect in the photoresist layer. In contrast, FIG. 5 shows an AFM micrograph of a polyethylene terephthalate (PET) film that shows the presence of large peaks rising above the mean height of surface (MHt). When these large peaks project into the photoresist layer, disadvantageous defect can result.

More particularly, the support film of the invention preferably has a peak height (Rp), defined a height difference between a mean height of surface (MHt) and height of the highest surface peak (q) located in the height profile (direction of z axis) of the selected area, of not more than about 300 nm by measuring with Atomic Force Microscope (AFM). The peak height (Rp) is more preferably not more than about 100 nm, which may be attained when an OPP or biaxial OPP (BOPP) film is used.

The mean height of surface (MHt) and peak height (Rp) are measured by Atom Force Microscope (AFM).

The Atom Force Microscope (AFM) generates attractive force or repulsive force according to lengthwise interval between atom of detector and atom of sample surface when micro detector fixed cantilever of AFM comes near to the surface of the supporting film.

By the above-mentioned phenomenon, the mean height of surface (MHt) and peak height (Rp) can be measured.

More detailly, the area of measuring (sample size) is defined as $20 \times 20$ μm$^2$.

The detector of AFM is contacted with the ten location selected optionally of the support film and the generated force of atom is measured by photodiode.

The mean height of surface (MHt) and peak height (Rp) are obtained by analyzing the generated force of atom measured by photodiode with second order fit.

At this time, Rp is an average of eight measured values excluding the maximum value and minimum value from the ten measured values.

If the Rp exceeds 300 nm, there may be a dimple or fish eye equal to the height of the highest surface peak on the surface of the photoresist layer when the substrate film is released from the photoresist layer after laminating the dry film resist, so that it causes a defect during development, after exposing the film to light.

Additionally, the highest surface peak is also formed because of the particles added (such as organic particles or inorganic particles) to improve smooth running properties in production of film, and/or other impurities generated during production of film.

The support film 10 of the invention should have satisfactory physical properties for the positive type photoresist resin film. Examples of suitable support film materials include, but are not restricted to, polycarbonate film, polyethylene (PE) film, polypropylene (PP) film, oriented polypropylene (OPP) film, polyethylene terephthalate (PET) film, polyethylene naphthalate (PEN) film, ethylene vinyl acetate (EVA) film, polyvinyl film, any suitable polyolefin film, epoxy film and the like. Particularly preferable polyolefin film is polypropylene (PP) film, polyethylene (PE) film, ethylene vinyl acetate (EVA) film, etc. A preferable polyvinyl film is polyvinyl chloride (PVC) film, polyvinyl acetate (PVA) film, polyvinyl alcohol (PVOH) film, etc. Particularly preferable polystyrene films are polystyrene (PS) film, acrylonitrile/butadiene/styrene (ABS) film, etc. Particularly, the support film is preferably transparent to allow light to pass through the support film and irradiate the photoresist resin layer.

The support film 10 may preferably have a thickness ranging from about 10 to 50 mm to serve as a framework for supporting shape of the positive type photoresist resin film, preferably a thickness ranging from about 15 to 50 mm, more preferably a thickness ranging from about 15 to 25 mm.

Next, the following discussion demonstrates constitutional ingredients of the positive type photoresist resin layer 20 according to the invention.

Generally speaking, resin materials can be thermoplastic or thermosetting. Thermoplastic is a type of plastic or resin that will repeatedly soften when heated and harden when cooled. The thermoplastic plastic can be molded and shaped when heated, keeping its shape when cool. A thermosetting resin or plastic is a material that will undergo or has already undergone a chemical reaction through heat and/or catalysts to form a solid. Once the thermosetting material has been heated, it does not go back to its original state and does not soften when reheated.

The alkali soluble resin used to prepare the positive type photoresist resin layer 20 of the invention preferably includes, but is not limited to, novolac resin as a condensation product of phenols and aldehydes and, most preferably cresol novolac resin.

Novolac resin is obtained by polycondensation of phenols alone or in combination with aldehydes and an acidic catalyst according to known reaction mechanisms.

Phenols include, but are not limited to, primary phenols such as phenol, o-cresol, m-cresol, p-cresol, 2,3-xylenol, 2,5-xylenol, 3,4-xylenol, 3,5-xylenol, 2,3,5-trimethylphenol-xylenol, 4-t-butylphenol, 2-t-butylphenol, 3-t-butylphenol, 4-methyl-2-t-butylphenol and the like; and polyhydric phenols such as 2-naphthol, 1,3-dihydroxy naphthalene, 1,7-dihydroxy naphthalene, 1,5-dihydroxyl naphthalene, resorcinol, pyrocatechol, hydroquinone, bisphenol A, phloroglucinol, pyrogallol and the like, which may be used alone or in combination. A combination of m-cresol and p-cresol is particularly preferred.

Suitable aldehydes include, but are not limited to, formaldehyde, trioxane, paraformaldehyde, benzaldehyde, acetaldehyde, propylaldehyde, phenylacetaldehyde, α or β-phenyl propylaldehyde, o-, m- or p-hydroxybenzaldehyde, glutaraldehyde, terephthalaldehyde and the like and may be used alone or in combination.

The cresol novolac resin for use in the invention preferably has a weight average molecular weight (based on GPC) ranging from about 2,000 to 30,000.

In addition, the cresol novolac resin for use in the invention preferably has a meta/para-cresol content in a mixing ratio by weight ranging from about 4:6 to 6:4, since the resin has varied physical properties such as photosensitizing speed and film residual rate dependent on the mixing ratio of the meta/para-cresol content.

If the meta-cresol content among the cresol novolac resin exceeds the above range, the photosensitizing speed becomes higher while the film residual rate is rapidly lowered. On the other hand, the photosensitizing speed becomes unfavorably slow when the para-cresol content exceeds the above range.

Although such cresol novolac resin having a meta/para-cresol content in the mixing ratio by weight ranging from about 4:6 to 6:4 can be used alone, more preferably used are resins with different molecular weights in combination. In this case, the cresol novolac resin is preferably a mixture of (I) cresol novolac resin having a weight average molecular weight (based on GPC) ranging from about 8,000 to 30,000 and (II) cresol novolac resin having a weight average molecular weight (based on GPC) ranging from about 2,000 to 8,000 in a mixing ratio ranging from about 7:3 to 9:1.

The term "weight average molecular weight" used herein refers to a conversion value of polystyrene equivalent determined by Gel Permeation Chromatography (GPC). If the weight average molecular weight is less than about 2,000, the photoresist resin film exhibits a dramatic thickness reduction in unexposed regions after development of the film. On the other hand, when the weight average molecular weight exceeds about 30,000, the development speed is lowered thereby reducing sensitivity. The novolac resin of the invention can achieve the most preferable effects when a resin obtained after removing low molecular weight ingredients present in the reaction product has a weight average molecular weight within the range (of about 2,000 to 30,000). In order to remove the low molecular weight ingredients from the novolac resin, conventional techniques known in the art including fractional precipitation, fractional dissolution, column chromatography and the like may be conveniently employed. As a result, performance of the photoresist resin film is improved, especially, scumming, thermal resistance, etc.

As an alkali soluble resin, the novolac resin can be dissolved in an alkaline solution without increase in volume and provides images exhibiting high resistance to plasma etching when the resin is used as a mask for the etching.

The diazide based photosensitive compound of the invention is used as a photosensitive material and, in addition, acts as a dissolution inhibitor to reduce alkali-solubility of the novolac resin. However, the diazide based photosensitive compound is converted into an alkali-soluble material when light is irradiated thereupon, thereby serving to increase the alkali-solubility of the novolac resin. Accordingly, the photosensitive compound is particularly useful for the positive type photoresist resin film due to alteration in solubility caused by light irradiation.

The diazide based photosensitive compound may be synthesized by esterification between a polyhydroxy compound and a quinonediazide sulfonic compound. The esterification for synthesizing the photosensitive compound comprises: dissolving the polyhydroxy compound and the quinonediazide sulfonic compound in a solvent such as dioxane, acetone, tetrahydrofuran, methylethylketone, N-methylpyrrolidine, chloroform, trichloroethane, trichloroethylene or dichloroethane; condensing the prepared solution by adding a basic catalyst such as sodium hydroxide, sodium carbonate, sodium hydrogen carbonate, triethylamine, N-methyl morpholine, N-methyl piperazine or 4-dimethyl aminopyridine to the solution; and washing, purifying and drying the resulting product. Desirable isomers can be selectively esterified and the esterification rate (average esterification rate) is not specifically limited, but is preferably in the range of about 20 to 100% and more preferably about 60 to 90% in terms of the esterification of the diazide sulfonic compound to OH groups of a polyhydroxy compound. When the esterification rate is too low, pattern structure and resolution are deteriorated. In contrast, deterioration of sensitivity occurs if the esterification rate is too high.

The quinonediazide sulfonic compound includes, for example, o-quinone diazide compounds such as 1,2-benzoquinone diazide-4-sulfonic acid, 1,2-naphthoquinone diazide-4-sulfonic acid, 1,2-benzoquinone diazide-5-sulfonic acid and 1,2-naphthoquinone diazide-5-sulfonic acid; and other quinone diazide sulfonic derivatives.

The quinonediazide sulfonic compound functions as a dissolution inhibitor to decrease the solubility of novolac resin in alkaline solutions. However, said compound is decomposed to produce alkali soluble resin during an exposure process and, thereby has a characteristic of accelerating the dissolution of novolac resin in an alkaline solution.

As the polyhydroxy compound, preferred examples are trihydroxybenzophenones such as 2,3,4-trihydroxy benzophenone, 2,2',3-trihydroxy benzophenone, 2,3,4'-trihydroxy benzophenone; tetrahydroxybenzophenones such as 2,3,4,4-tetrahydroxybenzophenone, 2,2',4,4'-tetreahydroxybenzophenone, 2,3,4,5-tetrahydroxybenzophenone; pentahydroxy benzophenones such as 2,2',3,4,4'-pentahydroxybenzophenone, 2,2',3,4,5-pentahydroxybenzophenone; hexahydroxybenzophenones such as 2,3,3',4,4',5'-hexahydroxybenzophenone, 2,2,3,3',4,5'-hexahydroxybenzophenone; gallic alkylester; oxyflavans; etc.

The diazide based photosensitive compound for use in the invention is preferably at least one selected from a group consisting of 2,3,4,4-tetrahydroxybenzophenone-1,2-naphthoquinonediazide-sulfonate, 2,3,4-trihydroxybenzo phenone-1,2-naphthoquinonediazide-5-sulfonate and (1-[1-(4-hydroxyphenyl)isopropyl]-4-[1,1-bis(4-hydroxyphenyl) ethyl]benzene)-1,2-naphtho quinonediazide-5-sulfonate. Also, the diazide based photosensitive compound prepared reacting polyhydroxybenzophenone and a diazide based compound such as 1,2-naphto quinonediazide, 2-diazo-1-naphthol-5-sulfonic acid may be used.

The diazide based photosensitive compound is described in Chapter 7 of Light Sensitive Systems, Kosar, J.; John Wiley & Sons, New York, 1965.

Such diazide based photosensitive compounds (that is, sensitizer) used as a constitutional ingredient of the positive type photoresist resin layer according to the invention is selected from substituted naphthoquinone diazide based sensitizers generally employed in positive type photoresist resin compositions, which is disclosed in, for example, U.S. Pat. Nos. 2,797,213; 3,106,465; 3,148,983; 3,201,329; 3,785,825; and 3,802,885.

The diazide based photosensitive compound described above is used alone or in combination in an amount of about 30 to 80 parts by weight, based on about 100 parts by weight of the alkali soluble resin. If less than about 30 parts by weight of the diazide based photosensitive compound is used, the compound does not undergo development in a developing solution and exhibits drastically reduced residual rate of the photoresist film. In contrast, if the amount exceeds about 80 parts by weight, costs are too high, thus being economically disadvantageous and, in addition, the solubility in the solvent becomes lower.

Such a diazide based photosensitive compound is capable of controlling photosensitizing speed of the positive type photoresist resin film according to the invention by procedures including, for example, the control of amount of the photosensitive compound and the control of esterification between the polyhydroxy compound such as 2,3,4-trihydroxybenzophenone and the quinonediazide sulfonic compound such as 2-diazo-1-naphthol-5-sulfonic acid.

The diazide based photosensitive compound reduces the solubility of alkali soluble resin in an aqueous alkali developing solution to about 1/100th that prior to exposure. However, after the exposure, the compound is converted into a carboxylic acid soluble in the alkaline solution, thereby exhibiting a solubility increase of about 1000 to 1500 fold, compared to non-exposed positive type photoresist compositions. The above characteristic is preferably employed in formation of micro-circuit patterns for devices such as LCDs, organic ELDs and the like. More particularly, a photoresist applied over a silicone wafer or a glass substrate is subjected to UV irradiation through a semiconductor mask in a circuit form, and then, is treated using the developing solution, resulting in a desired circuit pattern remaining on the silicone wafer or the glass substrate.

A sensitivity enhancer may be used for improving the sensitivity of the positive type photoresist resin film. The sensitivity enhancer comprises a polyhydroxy compound which contains about 2 to 7 phenol based hydroxy groups and has a weight average molecular weight less than about 1,000 relative to polystyrene. Preferred examples are at least one selected from a group consisting of 2,3,4-trihydroxybenzophenone, 2,3,4,4-tetrahydroxybenzophenone, 1-[1-(4-hydroxyphenyl)isopropyl]-4-[1,1-bis(4-hydroxyphenyl)ethyl] benzene.

The polyhydroxy compound serving as the sensitivity enhancer is preferably used in an amount of about 3 to 15 parts by weight based on about 100 parts by weight of the alkali soluble resin. If less than about 3 parts by weight of the polyhydroxy compound is used, it exhibits insignificant photosensitizing effects and unsatisfactory resolution and sensitivity. When the amount exceeds about 15 parts by weight, it exhibits high sensitivity but narrows window processing margin.

In addition to the above constitutional composition, generally known components such as other additives including leveling agents, dyes, pigments, surfactants, fillers and the like for use in conventional photoresist resin compositions may, of course, be included in the positive type photoresist resin layer according to the invention.

In accordance with the invention, the positive type photoresist resin layer 20 is prepared by admixing the composition comprising the alkali soluble resin, the diazide based photosensitive compound and the sensitivity enhancer, all of which are described above, with a constant amount of solvent; and applying the admixture to the support film 10 at a thickness of about 5 to 20 µm.

The process to form the positive type photoresist resin layer on the support film includes coating the support film with inventive composition and solvent by way of generally known coating methods using a roller, roll coater, gravure, meyer rod, sprayer, etc.; and drying the coated film to volatilize the solvent. If required, the applied composition may be treated by heating and curing.

The positive type photoresist resin film is usually adhered to a surface of the substrate by lamination and subjected to light irradiation prior to releasing the support film, followed by releasing the support film. Otherwise, after laminating the positive type resin film and releasing the support film, the positive type photoresist resin film may be subjected to light irradiation. However, irradiation can be performed either before or after the support film is removed.

Moreover, the prepared positive type photoresist resin film may further include a protective layer formed on top of the positive type photoresist resin layer. Such a protective layer serves to block air penetration and protect the positive type photoresist resin layer from impurities or contaminants and is preferably a polyethylene film, polyethylene terephthalate film, polypropylene film, etc. The protective layer preferably has a thickness ranging from about 15 to 30 μm.

The process for forming patterns using the inventive photoresist resin film may include:

(1) a step of forming the photoresist resin film, which is prepared by applying a photoresist resin layer to a support film, on a glass substrate and, optionally, releasing the support film from the photoresist resin film;

(2) a step of irradiating the prepared coating with UV irradiation through a mask or directly irradiating the prepared coating with UV irradiation not through a mask to generate a desired pattern; and (3) a step of forming a resist patterned coating which comprises removing the positive type photoresist resin coating in the UV irradiation portions by development after releasing the support film, in case that the support film was not released from the photoresist resin film.

A preferred example of the developing solution is about 2.38% TMAH (tetra-methyl-ammonium hydroxide) for developing the positive type photoresist resin film according to the invention.

In step (1), adhering the positive type photoresist resin film to the substrate positions the photoresist resin layer close to the support film, thereby completing formation of the positive type photoresist resin coating. The support film needs not be released. In addition, the photoresist resin coating formed on the substrate need not be dried.

Consequently, the desired resist patterned coating is formed through steps (1), (2) and (3).

The prepared positive type photoresist resin film comprising the photoresist resin layer on the support film solves problems such as reduced resolution or sensitivity during storage of the composition typically generated when using conventional liquid photoresist resin compositions, or eliminates the spin coating and/or drying processes conventionally required when applying a composition to the glass substrate, so that the invention can solve disadvantages of thickness deviation and foaming at the drying process, improve product yield and, especially, remarkably reduce processing costs.

The micro circuit pattern formed using the positive type photoresist resin film according to the invention exhibits high resolution on the order of about 2 to 7 μm, substantially similar or superior to that of a conventional liquid positive type photoresist resin composition, and therefore can be employed in fabrication of micro circuits such as LCDs, organic ELDs and the like.

However, when the above-described photoresist resin film is prepared, it may become difficult to produce the photoresist resin film since the composition has high Tg (glass transition temperature), which and inhibits release of the support film after 1 amination. That is, the adhesion properties of a high Tg material may prevent a clean release of the support film.

In the related art, U.S. Pat. No. 4,550,069 may mention the use of plasticizers as additives to positive photoresist, but this technology is used for conventional spin-coated resists and is not directed at the problem of clean removal of a substrate backing.

Accordingly, the invention may further incorporate a plasticizer which is preferably at least one of dibutyl phthalate (DBP), dioctyl phthalate (DOP), dimethyl phthalate (DMP), polyethylene glycol (PEG) and silicone based oils. However, any suitable plasticizer can be used in the invention, including phthalates, sebacates, trimellitates, acetates, maleates, methyl diethanolamine (MDEA) and ethylene oxide derivatives. Among these, particularly preferable is a silicone based oil having a weight average molecular weight ranging from 1,400 to 4,600 with epoxy groups at both terminals thereof.

The content of the plasticizer preferably ranges from about 3 to 35 parts by weight based on 100 parts by weight of the alkali soluble resin. If less than about 3 parts by weight of the plasticizer is used, it can not ensure stable lamination with the substrate during lamination. When the amount of plasticizer exceeds about 35 parts by weight, micro foams are generated during lamination.

Furthermore, the positive type photoresist resin layer of the invention may further include a releasing agent to improve release properties of the support film after lamination, other than the above ingredients. Preferred examples of the releasing agent are silicone resin, fluoro resin (fluorinated resin), fluorinated silicone resin, olefin resin, wax, etc. Among these, particularly preferable is a fluoro resin or fluorinated silicone resin with a viscosity ranging from about 1,000 to 10,000 cps.

The content of the releasing agent preferably ranges from about 0.5 to 4 parts by weight based on 100 parts by weight of the alkali soluble resin.

In the invention, the positive type photoresist resin layer 20 may be prepared by mixing the alkali soluble resin, the diazide based photosensitive compound, the plasticizer, the sensitivity enhancer and, optionally, the releasing agent, all of which are described above, with a solvent; and applying the mixture to the support film 10 at a thickness of about 5 to 20 μm.

The process to form the plasticized positive type photoresist resin layer on the support film includes coating the support film with the admixture of the present inventive composition and the solvent by way of generally known coating methods using a roller, roll coater, meyer rod, gravure, sprayer, etc. Then, the coated film is dried to volatilize the solvent. If required, the applied composition may be treated by heating and curing. A protective film may then be layered over the resin layer.

In a preferred embodiment of the invention, the positive type photoresist resin composition contains an alkali soluble resin, a diazide based photosensitive compound, a sensitivity enhancer, a plasticizer, a solvent and, optionally, a releasing agent. The composition preferably comprises about 30 to 80 parts by weight of the diazide based photosensitive compound, about 3 to 15 parts by weight of the sensitivity enhancer, about 3 to 35 parts by weight of the plasticizer and the balance of the solvent, based on 100 parts by weight of the alkali soluble resin.

Since the constitutional ingredients such as the alkali soluble resin, the diazide based photosensitive compound, the sensitivity enhancer, the plasticizer, the releasing agent and other additives are substantially similar to those of the photoresist resin layer 20 described above, redundant explanations will be omitted.

The solvent used in construction of the positive type photoresist resin composition is evaporated at a constant speed to form a homogeneous and soft coating film after evaporation. The solvent may be acetone, cyclopentanone, cyclohexanone, methylethylketone, ethyl cellosolve acetate, ethyl acetate, butyl acetate, ethylene glycol and xylene, ethylene glycol monoethylether, methyl cellosolve acetate, ethyl cellosolve acetate, diethyleneglycol monoethylether alone or in combination thereof in any relative ratio. That is, the solvent is commonly employed for the purpose of assisting various ingredients of the photoresist resin composition to be homogeneously blended in the composition and controlling viscosity of the composition sufficient to be easily applied to the support film.

In addition to the above ingredients, the photoresist resin composition of the invention may further contain other components such as an absorber, a cross-linking agent, an auxiliary adhesive to improve visibility, a sensitivity control agent, a thermal resistance agent, a dry etching resistance agent, etc.

BRIEF DESCRIPTION OF THE DRAWINGS

Other objects and aspects of the invention will become apparent from the following description of embodiments with reference to the accompanying drawings in which:

FIG. 1 illustrates a structure of a positive type photoresist resin film according to the invention.

FIG. 2 shows a substrate film with a large anomaly.

FIG. 3 shows a substrate film without a large anomaly.

FIG. 4 shows an atomic force microscopy (AFM) micrograph of a substrate film without large anomalies.

FIG. 5 shows an AFM micrograph of a substrate film with large anomalies.

The above described features and other advantages of the invention will become more apparent from the following non-restrictive examples. However, it should be understood that these examples are intended to illustrate the invention more fully as practical embodiments and do not limit the scope of the invention.

EXAMPLE 1

A solution is prepared that contains a cresol novolac resin which has a meta/para-cresol content in a mixing ratio by weight of 4:6 and includes (I) cresol novolac resin having a weight average molecular weight of 8,000 and (II) cresol novolac resin having a weight average molecular weight of 2,000 in a mixing ratio of 7:3 as the alkali soluble resin; 40 parts by weight of 2,3,4-trihydroxybenzophenone-1,2-naphthoquinonediazide-5-sulfonate as a photosensitive compound; 5 parts by weight of 2,3,4,4-tetrahydroxybenzophenone as a sensitivity enhancer; 5 parts by weight of dibutyl phthalate as the plasticizer; and the balance being a solvent, dye and/or a leveling agent based on 100 parts by weight of the above alkali soluble resin. The prepared solution was subjected to filtering through a 0.2 μm Millipore TEFLON (poly tetrafluoroethylene) filter to remove insoluble materials. The resulting solution was applied to a polyethylene terephthalate (PET) film (19 μm thickness) at a thickness of 5 μm to form a photoresist resin layer, thereby producing a positive type photoresist resin film.

EXAMPLE 2

A positive type photoresist resin film was prepared in the same manner as in Example 1, except that the alkali soluble resin was a cresol novolac resin having a meta/para-cresol content in a mixing ratio by weight of 4:6 and including (I) cresol novolac resin having a weight average molecular weight of 10,000 and (II) cresol novolac resin having a weight average molecular weight of 3,000 in a mixing ratio of 7:3; the photosensitive compound was 40 parts by weight of 2,3,4,4-tetrahydroxybenzophenone-1,2-naphthoquinonediazide-sulfonate based on 100 parts by weight of the alkali soluble resin; and, in addition, 0.5 parts by weight of fluorine based silicone resin having a viscosity of 1,000 cps was added as a releasing agent.

EXAMPLE 3

A positive type photoresist resin film was prepared in the same manner as in Example 1, except that the alkali soluble resin was a cresol novolac resin having a meta/para-cresol content in a mixing ratio by weight of 4:6 and including (I) cresol novolac resin having a weight average molecular weight of 12,000 and (II) cresol novolac resin having a weight average molecular weight of 4,000 in a mixing ratio of 7:3; and the photosensitive compound was 40 parts by weight of 1-[1-(4-hydroxyphenyl)isopropyl]-4-[1,1-bis(4-hydroxyphenyl)ethyl]benzene) 1,2-naphthoquinonediazide-5-sulfonate based on 100 parts by weight of the alkali soluble resin.

EXAMPLE 4

A positive type photoresist resin film was prepared in the same manner as in Example 1, except that the alkali soluble resin was a cresol novolac resin having a meta/para-cresol content in a mixing ratio by weight of 5:5 and including (I) cresol novolac resin having a weight average molecular weight of 14,000 and (II) cresol novolac resin having a weight average molecular weight of 5,000 in a mixing ratio of 8:2; and the photosensitive compound was 20 parts by weight of 2,3,4-trihydroxybenzophenone-1,2-naphthoquinonediazide-5-sulfonate and 20 parts by weight of 2,3,4,4-tetrahydroxybenzophenone-1,2-naphthoquinonediazide-sulfonate based on 100 parts by weight of the alkali soluble resin.

EXAMPLE 5

A positive type photoresist resin film was prepared in the same manner as in Example 1, except that the alkali soluble resin was a cresol novolac resin having a meta/para-cresol content in a mixing ratio by weight of 5:5 and including (I) cresol novolac resin having a weight average molecular weight of 18,000 and (II) cresol novolac resin having a weight average molecular weight of 6,000 in a mixing ratio of 8:2; and the photosensitive compound was 20 parts by weight of 2,3,4-trihydroxybenzophenone-1,2-naphthoquinonediazide-5-sulfonate and 20 parts by weight of 1-[1-(4-hydroxyphenyl)isopropyl]-4-[1,1-bis(4-hydroxyphenyl)ethyl]benzene) 1,2-naphthoquinone diazide-5-sulfonate based on 100 parts by weight of the alkali soluble resin.

EXAMPLE 6

A positive type photoresist resin film was prepared in the same manner as in Example 1, except that the alkali soluble resin was a cresol novolac resin having a meta/para-cresol content in a mixing ratio by weight of 5:5 and including (I) cresol novolac resin having a weight average molecular weight of 18,000 and (II) cresol novolac resin having a weight average molecular weight of 7,000 in a mixing ratio of 8:2; the sensitivity enhancer was 5 parts by weight of 1-[1-(4-hydroxyphenyl)isopropyl]-4-[1,1-bis(4-hydroxyphenyl) ethyl]benzene) and the plasticizer was 5 parts by weight of dioctylphthalate based on 100 parts by weight of the alkali soluble resin; and, in addition, 0.5 parts by weight of fluorine based silicone resin having a viscosity of 1,000 cps was added as a releasing agent.

Each of the obtained positive type photoresist resin films from Examples 1 to 6 was laminated onto a substrate with lamination speed of 0.5 to 3.5 m/min, at a temperature of 100 to 130° C. and under a heating roller pressure of 10 to 90 psi, exposed to UV radiation using a photomask and developed in 2.38% TMAH (tetra-methyl-ammonium hydroxide) after releasing the support film, resulting in formation of a micro pattern. Physical properties of the formed pattern were evaluated according to the following methods and the results are shown in Table 1.

Evaluation of Physical Properties

Physical properties of the positive type patterns produced in Examples 1 to 6 were evaluated according to the following methods and the results are shown in Table 1.

(1) Sensitivity

After exposing each of the prepared positive type resin films to UV irradiation with varied light amount, the film was developed using 2.38% by mass of TMAH solution for 60 seconds and washed for 30 seconds then dried. The exposure amount of the resulting film was measured using an optical microscope.

(2) Thermal Resistance

After formation of a resist pattern by the same manner for evaluating the sensitivity, the resist pattern was placed on a hot plate at 150° C. and subjected to heating for 2 minutes. A scanning electron microscope (SEM) was used to observe cross-sections of the resist patterns while using an a-step for observing surface of the resist pattern.

The condition of the resist patterns was evaluated as follows: ⊚ when variation in shape and surface of the resist pattern is not more than 3% after heating; Δ for a variation ranging from 3 to 5%; and X for a variation greater than 10%, relative to thickness of the pattern.

(3) Resolution

After lamination of the prepared positive type photoresist resin film onto the substrate at a lamination speed of 0.5 to 3.5 m/min, at a temperature of 100 to 130° C. and under a heating roller pressure of 10 to 90 psi, the laminated film was subjected to UV irradiation using the photomask and releasing polyethylene terephthalate (PET) film as the support film. Subsequently, the photoresist resin film was developed using 2.38% TMAH alkali developer, thereby resulting in a micro circuit with unexposed regions. Resolution of the formed pattern was observed using a scanning electron microscope (SEM).

(4) Lamination Properties

The prepared photoresist resin composition was applied to a polyethylene terephthalate substrate film in a thickness of 5 μm to form a photoresist resin film having a photoresist resin layer. Then, the film was laminated onto an indium tin oxide (ITO) glass at 110° C. The condition of the resulting film was visibly evaluated and indicated as ⊚ for superior lamination, Δ for normal condition and X for poor lamination.

(5) Film Release Properties

After lamination of the prepared positive type photoresist dry film onto a glass substrate coated with ITO to a depth of 2000 and a width of 100×100 mm² at a lamination speed of 2 m/min, at a temperature of 110° C. under a heating roller pressure of 10 to 90 psi, the support film was peeled off from the photoresist layer. By evaluating release properties of the dry film using UTM (Universal Test Machine; Instron Inc.), peeling strength of the film during releasing was determined by UTM.

As shown in Table 1, the micro circuit patterns formed with the positive type photoresist resin films according to Examples 1 to 6 exhibit excellent characteristics such as sensitivity, thermal resistance, resolution, release properties and lamination properties. Accordingly, the photoresist resin film of the invention can form a micro circuit pattern on a substrate used in devices such as LCDs or organic ELDs.

Compared to the use of conventional liquid photoresist resin compositions, the invention exhibits physical properties such as photosensitizing speed, development contrast, resolution, adhesiveness to a substrate, film residual rate, circuit line width uniformity (CD uniformity), etc. equal or superior to those of the conventional compositions in formation of micro circuit patterns on a substrate used in devices such as LCDs, organic ELDs and the like, thereby offering an improved positive type photoresist resin film suitable for use in lithography of TFT-LCDs, organic ELDs and the like.

Additionally, using the positive type photoresist resin film can eliminate spin-coating processes and drying processes required in formation of micro circuit patterns using conventional liquid photoresist resin compositions. Accordingly, the invention can solve typical problems of the above processes such as thickness deviation, poor smoothness, distortion, coagulation, foaming at drying and solvent output, etc., especially, can simplify the fabrication process since the spin-coating and drying processes are not required, thereby enhancing workability and economic benefit.

Furthermore, the positive type photoresist resin film of the invention has no problems associated with resolution and/or sensitivity reduction which causes a difficulty in storage of conventional liquid compositions.

EXAMPLE 7

A positive type photoresist composition for forming a positive type photoresist layer is prepared as follows.

A solution was prepared containing: a cresol novolac resin which has a meta/para-cresol content in a mixing ratio by weight of 4:6 and includes (i) cresol novolac resin having a weight average molecular weight of 8,000 and (ii) cresol novolac resin having a weight average molecular weight of 2,000 in a mixing ratio of 7:3 as the alkali soluble resin; 40 parts by weight of 2,3,4-trihydroxybenzophenone-1,2-naphthoquinonediazide-5-sulfonate as the photosensitive compound; 5 parts by weight of 2,3,4,4-tetrahydroxybenzophenone as the sensitivity enhancer; 5 parts by weight of dibutyl phthalate as the plasticizer; and the balance of a solvent, dye and/or a leveling agent based on 100 parts by weight of the above alkali soluble resin. The prepared solution was subjected to filtering through a 0.2 μm Millipore TEFLON (polytetrafluoroethylene) filter to remove insoluble materials. The resultant solution was applied to a BOPP (bi-axially oriented polypropylene) film having physical properties listed in Table 2 and Table 3 as the support film in thickness of 5 μm to form a positive type photoresist layer, thereby producing the positive type photoresist dry film.

TABLE 1

| | Sensitivity (mJ/cm²) | Thermal resistance evaluation | Resolution (μm) | Lamination properties | Release properties |
|---|---|---|---|---|---|
| Example 1 | 70 | ⊚ | 4.5 | ⊚ | 55.7 |
| Example 2 | 60 | ⊚ | 3.5 | ⊚ | 58.7 |
| Example 3 | 50 | ⊚ | 5.5 | ⊚ | 68.8 |
| Example 4 | 65 | ⊚ | 4.5 | ⊚ | 65.4 |
| Example 5 | 60 | ⊚ | 5.0 | ⊚ | 62.3 |
| Example 6 | 60 | ⊚ | 5.0 | ⊚ | 55.4 |
| Example 7 | 60 | ⊚ | 3.2 | ⊚ | 52.8 |

TABLE 2

Comparison of thermal and mechanical properties in the support film.

| Physical properties | OPP | PET |
|---|---|---|
| Thickness (μm) | 30 | 19 |
| Melting point (° C.) | 171.4 | 251.4 |

(PET physical properties mean physical properties of PET used in Examples 1 to 6)

TABLE 3

Measuring results for MHt and Rp of BOPP film used in Example 7.

| Region Group | Rp – v[μm] | Rms rough[μm] | Ave rough[μm] | MHt[μm] | Rp[μm] | Valley(Rv)[μm] |
|---|---|---|---|---|---|---|
| OPP-1 | 0.0804 | 0.0077 | 0.0061 | 0.0322 | 0.0482 | −0.0322 |
| OPP-2 | 0.0789 | 0.0080 | 0.0063 | 0.0343 | 0.0446 | −0.0343 |
| OPP-3 | 0.1198 | 0.0081 | 0.0061 | 0.0461 | 0.0737 | −0.0461 |
| OPP-4 | 0.1438 | 0.0084 | 0.0063 | 0.0480 | 0.0958 | −0.0480 |
| OPP-5 | 0.0650 | 0.0064 | 0.0050 | 0.0272 | 0.0378 | −0.0272 |
| OPP-6 | 0.1028 | 0.0099 | 0.0076 | 0.0479 | 0.0549 | −0.0479 |
| OPP-7 | 0.0759 | 0.0069 | 0.0054 | 0.0288 | 0.0471 | −0.0288 |
| OPP-8 | 0.0728 | 0.0075 | 0.0059 | 0.0321 | 0.0407 | −0.0321 |
| Average | 0.0924 | 0.0079 | 0.0061 | 0.0371 | 0.0554 | −0.0371 |

TABLE 4

Measuring results for MHt and Rp of PET film used in Example 1 to 6.

| Region Group | Rp – v[μm] | Rms rough[μm] | Ave rough[μm] | MHt[μm] | Rp[μm] | Valley(Rv)[μm] |
|---|---|---|---|---|---|---|
| PET-1 | 0.2322 | 0.0112 | 0.0072 | 0.0732 | 0.1590 | −0.0732 |
| PET-2 | 0.4342 | 0.0210 | 0.0101 | 0.2584 | 0.1757 | −0.2584 |
| PET-3 | 0.1724 | 0.0065 | 0.0037 | 0.0444 | 0.1280 | −0.0444 |
| PET-4 | 0.2009 | 0.0131 | 0.0088 | 0.0613 | 0.1396 | −0.0613 |
| PET-5 | 0.1340 | 0.0053 | 0.0034 | 0.0336 | 0.1003 | −0.0336 |
| PET-6 | 0.1161 | 0.0040 | 0.0025 | 0.0249 | 0.0913 | −0.0249 |
| PET-7 | 0.1602 | 0.0046 | 0.0024 | 0.0415 | 0.1187 | −0.0415 |
| PET-8 | 0.1378 | 0.0059 | 0.0030 | 0.0420 | 0.0958 | −0.0420 |
| Average | 0.1985 | 0.0089 | 0.0051 | 0.0724 | 0.1260 | −0.0724 |

In the Table 3~4, Rp-v is a distance between maximum peak height and minimum valley height located in the height profile (direction of z axis) of the selected area.

Rms rough is a standard derivation of datas with 8 numbers against mean height of surface (MHt) and Ave rough is an average derivation of datas with 8 numbers against mean height of surface (MHt).

Valley (Rv) is a distance between minimum valley height and mean height of surface (MHt) located in the height profile (direction of z axis) of the selected area.

Definition of Rp and MHt are already described.

It is to be understood that the foregoing descriptions and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

The invention claimed is:

1. A positive type dry film resist, comprising:
a support film, the support film having a peak height (Rp), defined as a height difference between a mean height of surface (MHt) and a height of a highest surface peak located in the height profile (in the z-axis direction) of a selected area, of not more than about 300 nm and a thickness of the support film ranges from about 15 to 50 μm; and
a photoresist layer on and in contact with the support film, wherein the photoresist layer includes an alkali soluble resin, a diazide based photosensitive compound and a plasticizer, and a thickness of the photoresist layer is not more than 10 μm.

2. The positive type dry film resist according to claim 1, wherein the photoresist layer further includes a sensitivity enhancer.

3. The positive type dry film resist according to claim 1, wherein the peak height (Rp) is not more than about 100 nm.

4. The positive type dry film resist of claim 1, wherein the photoresist layer is composed of a positive photoresist.

5. The positive type dry film resist according to claim 1, wherein the alkali soluble resin is novolac resin.

6. The positive type dry film resist according to claim 1, wherein the photoresist layer is composed of cresol novolac resin.

7. The positive type dry film resist according to claim 2, wherein the photoresist layer comprises about 30 to 80 parts by weight of the diazide based photosensitive compound, about 3 to 15 parts by weight of the sensitivity enhancer and about 3 to 35 parts by weight of the plasticizer, based on 100 parts by weight of the alkali soluble resin.

8. The positive type dry film resist according to claim 1, wherein the diazide based photosensitive compound is at least one selected from a group consisting of 2,3,4,4-tetrahydroxybenzophenone-1,2-naphthoquinonediazide-sulfonate, 2,3,4-trihydroxybenzophenone-1,2-naphthoquinonediazide-5-sulfonate and (1-[1-(4-hydroxyphenyl)-isopropyl]-4-[1,1-bis(4-hydroxyphenyl)ethyl]benzene)1,2-naphthoquinonediazide-5-sulfonate.

9. The positive type dry film resist according to claim 6, wherein the cresol novolac resin has a weight average molecular weight (based on GPC) ranging from about 2,000 to 30,000.

10. The positive type dry film resist according to claim 6, wherein the cresol novolac resin has a meta/para-cresol content in a mixing ratio by weight ranging from about 4:6 to 6:4.

11. The positive type dry film resist according to claim 6, wherein the cresol novolac resin is a mixture of (I) cresol novolac resin having a weight average molecular weight (based on GPC) ranging from about 8,000 to 30,000 and (II) cresol novolac resin having a weight average molecular weight (based on GPC) ranging from about 2,000 to 8,000 in a mixing ratio therebetween ranging from about 7:3 to 9:1.

12. The positive type dry film resist according to claim 2, wherein the sensitivity enhancer is at least one selected from a group consisting of 2,3,4-trihydroxybenzophenone, 2,3,4,4-tetrahydroxybenzophenone and (1-[1-(4-hydroxyphenyl)isopropyl]4-[1,1-bis(4-hydroxyphenyl)ethyl]benzene).

13. The positive type dry film resist according to claim 1, wherein the plasticizer is at least one selected from a group consisting of dibutyl phthalate (DBP), dioctyl phthalate (DOP), dimethyl phthalate (DMP), polyethyleneglycol (PEG) and
silicone based oils.

14. The positive type dry film resist according to claim 4, wherein the positive photoresist layer further comprises a releasing agent.

15. The positive type dry film resist according to claim 14, wherein the positive photoresist layer contains about 0.5 to 4 parts by weight of the releasing agent, based on 100 parts by weight of the alkali soluble resin.

16. The positive type dry film resist according to claim 14, wherein the releasing agent is fluorine based silicone.

17. The positive type dry film resist according to claim 1, wherein the support film is composed of polyethylene terephthalate, polyethylene naphthalate, polycarbonate, ethylene vinyl acetate, ethylene vinyl alcohol, polyvinyl chloride, polyvinyl acetate, polyvinyl alcohol, polystyrene, acrylonitrile/butadiene/styrene, epoxy or a polyolefin selected from the group consisting of polyethylene, polypropylene and oriented polypropylene.

18. The positive type dry film resist according to claim 1, wherein the dry film resist further comprises a protective layer formed on top of the photoresist layer.

19. The positive type dry film resist according to claim 15, wherein the protective layer is composed of polyethylene, polyethylene terephthalate or polypropylene.

20. The positive type dry film resist according to claim 15, wherein a thickness of the protective layer ranges from about 15 to 30 μm.

21. The positive type dry film resist according to claim 1, wherein the photoresist layer contains a thermosetting polymer.

* * * * *